(12) United States Patent
Kim (10) Patent No.: US 10,580,497 B2
(45) Date of Patent: Mar. 3, 2020

(54) MEMORY DEVICE, MEMORY SYSTEM INCLUDING THE SAME, AND METHOD OF OPERATING THE MEMORY SYSTEM

(71) Applicant: SK hynix Inc., Gyeonggi-do (KR)

(72) Inventor: Kwang Su Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/114,644

(22) Filed: Aug. 28, 2018

(65) Prior Publication Data

US 2019/0237144 A1 Aug. 1, 2019

(30) Foreign Application Priority Data

Jan. 31, 2018 (KR) ........................ 10-2018-0012267

(51) Int. Cl.
*G11C 7/00* (2006.01)
*G11C 16/16* (2006.01)
*H01L 27/11573* (2017.01)
*H01L 27/1157* (2017.01)
*G11C 16/26* (2006.01)
*G11C 16/08* (2006.01)
*G11C 16/24* (2006.01)
*G11C 16/04* (2006.01)
*G11C 16/10* (2006.01)

(52) U.S. Cl.
CPC .......... *G11C 16/16* (2013.01); *G11C 16/0483* (2013.01); *G11C 16/08* (2013.01); *G11C 16/10* (2013.01); *G11C 16/24* (2013.01); *G11C 16/26* (2013.01); *H01L 27/1157* (2013.01); *H01L 27/11573* (2013.01)

(58) Field of Classification Search
CPC ..... G11C 16/16; G11C 16/0483; G11C 16/08; G11C 16/24; G11C 16/26; H01L 27/1157; H01L 27/11573
USPC ........................................................ 365/218
See application file for complete search history.

(56) References Cited

U.S. PATENT DOCUMENTS

| | | | | |
|---|---|---|---|---|
| 5,953,737 A | * | 9/1999 | Estakhri | .................. G06F 3/061 |
| | | | | 711/103 |
| 8,769,190 B1 | * | 7/2014 | Syu | ......................... G06F 3/061 |
| | | | | 711/103 |
| 9,563,504 B2 | | 2/2017 | Liang et al. | |
| 9,583,201 B1 | * | 2/2017 | Lee | ......................... G11C 16/16 |
| 9,875,053 B2 | * | 1/2018 | Frid | ....................... G06F 3/0634 |
| 9,921,954 B1 | * | 3/2018 | Sabbag | ............... G06F 12/0246 |
| 2004/0151031 A1 | * | 8/2004 | Tanaka | ................. G11C 16/349 |
| | | | | 365/185.29 |

(Continued)

Primary Examiner — Viet Q Nguyen
(74) Attorney, Agent, or Firm — IP & T Group LLP (57) ABSTRACT

Provided herein may be a memory device, a memory system including the memory device, and a method of operating the memory system. The memory device may include: a memory cell array including a plurality of memory blocks; a peripheral circuit configured to perform a program operation and an erase operation on any of the plurality of memory blocks; and a logic group configured to control the peripheral circuit to perform the program operation and the erase operation. The logic group may control the peripheral circuit to perform, during the program operation on a first memory block, selected as a current open block among the plurality of memory blocks, sub-operations of an erase operation on a second memory block to be selected as a subsequent open block.

19 Claims, 9 Drawing Sheets

(56) References Cited

U.S. PATENT DOCUMENTS

| | | | | |
|---|---|---|---|---|
| 2006/0085493 A1* | 4/2006 | Kim | .................. | G06F 3/0608 |
| 2006/0184718 A1* | 8/2006 | Sinclair | .................. | G06F 3/0608 |
| | | | | 711/103 |
| 2006/0221719 A1* | 10/2006 | Maeda | .................. | G06F 3/0611 |
| | | | | 365/189.05 |
| 2009/0059695 A1* | 3/2009 | Kim | .................. | G11C 29/808 |
| | | | | 365/200 |
| 2010/0070729 A1* | 3/2010 | Ng | .................. | G06F 3/0617 |
| | | | | 711/166 |
| 2012/0191937 A1* | 7/2012 | Feldman | .................. | G06F 12/0253 |
| | | | | 711/170 |
| 2013/0227207 A1* | 8/2013 | Katz | .................. | G06F 12/0246 |
| | | | | 711/103 |
| 2013/0227246 A1* | 8/2013 | Hirao | .................. | G06F 12/0246 |
| | | | | 711/206 |
| 2016/0133329 A1* | 5/2016 | Moon | .................. | G11C 16/14 |
| | | | | 365/185.11 |
| 2016/0172045 A1* | 6/2016 | Shukla | .................. | G11C 16/0483 |
| | | | | 365/185.12 |
| 2016/0216894 A1* | 7/2016 | Nango | .................. | G06F 3/0604 |
| 2017/0285950 A1* | 10/2017 | Lee | .................. | G06F 3/064 |
| 2018/0122489 A1* | 5/2018 | Ray | .................. | G11C 16/3418 |

* cited by examiner

MEMORY DEVICE, MEMORY SYSTEM INCLUDING THE SAME, AND METHOD OF OPERATING THE MEMORY SYSTEM

CROSS-REFERENCE TO RELATED APPLICATION

The present application claims priority under 35 U.S.C. § 119(a) to Korean patent application number 10-2018-0012267, filed on Jan. 31, 2018, the entire disclosure of which is incorporated herein by reference in its entirety.

BACKGROUND

1. Field of Invention

Various embodiments of the present disclosure generally relate to an electronic device. Particularly, the embodiments relate to a memory device, a memory system including the memory device, and a method of operating the memory system.

2. Description of Related Art

The computer environment paradigm has recently shifted to ubiquitous computing in which computer systems can be used anytime and anywhere. As a result, the use of portable electronic devices such as mobile phones, digital cameras, and laptop computers has rapidly increased. In general, such portable electronic devices use a memory system which employs a memory device, in other words, a data storage device. The data storage device is used as a main memory device or an auxiliary memory device of the portable electronic devices.

Since there is no mechanical driving part, a data storage device using a memory device provides advantages such as excellent stability and durability, high information access speed, and low power consumption. Data storage devices, as an example of the memory system having such advantages, may include a universal serial bus (USB) memory device, a memory card having various interfaces, and a solid state drive (SSD).

SUMMARY

Various embodiments of the present disclosure are directed to a memory device capable of reducing, when changing a selected block from a current open block to a subsequent open block during a program operation, the time required to perform an erase operation on the subsequent open block, a memory system including the memory device, and a method of operating the memory system.

An embodiment of the present disclosure may provide for a memory device including: a memory cell array including a plurality of memory blocks; a peripheral circuit configured to perform a program operation and an erase operation on any of the plurality of memory blocks; and a logic group configured to control the peripheral circuit to perform the program operation and the erase operation. The logic group may control the peripheral circuit to perform, during the program operation on a first memory block, selected as a current open block among the plurality of memory blocks, sub-operations of an erase operation on a second memory block to be selected as a subsequent open block.

An embodiment of the present disclosure may provide for a memory system including: a memory device comprising a plurality of memory blocks, and configured to select a current open block and a subsequent open block among the plurality of memory blocks, and perform a program operation on each of the selected open blocks; and a memory controller configured to control the memory device to perform the program operation in response to a request from a host such that, while performing the program operation on the current open block, the memory device performs sub-operations of an erase operation on the subsequent open block.

An embodiment of the present disclosure may provide for a method of operating a memory system, including: selecting a current open block and a subsequent open block among a plurality of memory blocks during a program operation; performing a first program operation on one of at least two page groups in the current open block; performing a first erase operation on the subsequent open block, the first erase operation using a first erase voltage group; performing a second program operation on another one of the at least two page groups in the current open block; and performing a second erase operation on the subsequent open block, the second erase operation using a second erase voltage group having an erase voltage level higher than an erase voltage level of the first erase voltage group.

An embodiment of the present disclosure may provide for a memory system including: a plurality of memory blocks; a peripheral circuit; and a control circuit configured to control the peripheral circuit to perform program and erase operations on the memory blocks, wherein the control circuit controls, when the erase operation is required for a subsequent target memory block for the program operation, the peripheral circuit to alternately perform the program operation to a current target memory block and the erase operation to the subsequent target memory block, and wherein the erase operation is performed in an incremental step pulse erase (ISPE) manner using a plurality of erase voltage groups during the alternate operations.

DETAILED DESCRIPTION

Various embodiments will now be described more fully hereinafter with reference to the accompanying drawings; however, elements and features of the present disclosure may be arranged or configured differently than shown or described herein. Thus, the present invention is not limited to the embodiments set forth herein. Rather, these embodiments are provided so that this disclosure is thorough and complete and fully conveys the scope of the embodiments to those skilled in the art. Throughout the specification, reference to "an embodiment" or the like is not necessarily to only one embodiment, and different references to "an embodiment" or the like are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present.

Embodiments are described herein with reference to sectional and schematic illustrations of elements and intermediate structures. As such, variations from the shapes shown in the illustrations as a result, for example, of manufacturing techniques and/or tolerances, are to be expected. Thus, embodiments should not be construed as limited to particular shapes of elements, structures or regions thereof illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they do not limit the various components. Those terms are only used for the purpose of differentiating a component from other components having the same or similar names. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless the context indicates otherwise. Furthermore, "include/comprise" or "including/comprising" used in the specification represents that one or more components, steps, operations, and elements exist or are added but does not preclude the existence or addition of other component(s), step(s), operation(s) and/or element(s).

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without an intermediate component.

Figure 1:
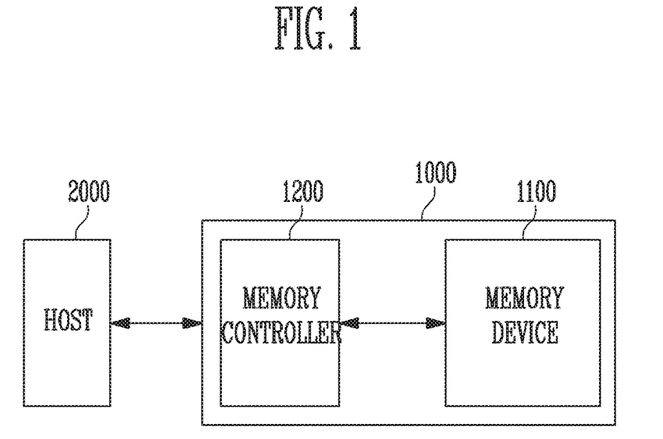
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a memory device 1100 configured to store data, and a controller 1200 configured to control the memory device 1100 under control of a host 2000.

The host 2000 may communicate with the memory system 1000 using an interface protocol such as a peripheral component interconnect-express (PCI-E) protocol, an advanced technology attachment (ATA) protocol, a serial ATA (SATA) protocol, a parallel ATA (PATA) protocol, or a serial attached SCSI (SAS) protocol. However, the interface protocol provided for the purpose of data communication between the host 2000 and the memory system 1000 is not limited to the foregoing examples; alternatively, such protocol may be any one of interface protocols such as a universal serial bus (USB) protocol, a multi-media card (MMC) protocol, an enhanced small disk interface (ESDI) protocol, and an integrated drive electronics (IDE) protocol.

The memory controller 1200 may control the overall operation of the memory system 1000 and data exchange between the host 2000 and the memory device 1100. For instance, the memory controller 1200 may control the memory device 1100 to program or read data in response to a request of the host 2000. In an embodiment, the memory device 1100 may include a double data rate synchronous dynamic random access memory (DDR SDRAM), a low power double data rate4 (LPDDR4) SDRAM, a graphics double data rate (DDDR) SDRAM, a low power DDR (LPDDR), a rambus dynamic random access memory (RDRAM), or a flash memory.

The memory device 1100 may perform a program operation, a read operation, or an erase operation under control of the memory controller 1200.

During a program operation, under control of the memory controller 1200, the memory device 1100 may select, from among a plurality of memory blocks, both an open block on which the program operation is to be performed and a subsequent open block on which other data is to be programmed after the program operation on the open block has been completed. In addition, the memory device 1100 may perform sub-operations of an erase operation on the subsequent open block during the program operation on the open block under control of the memory controller 1200.

Figure 2:
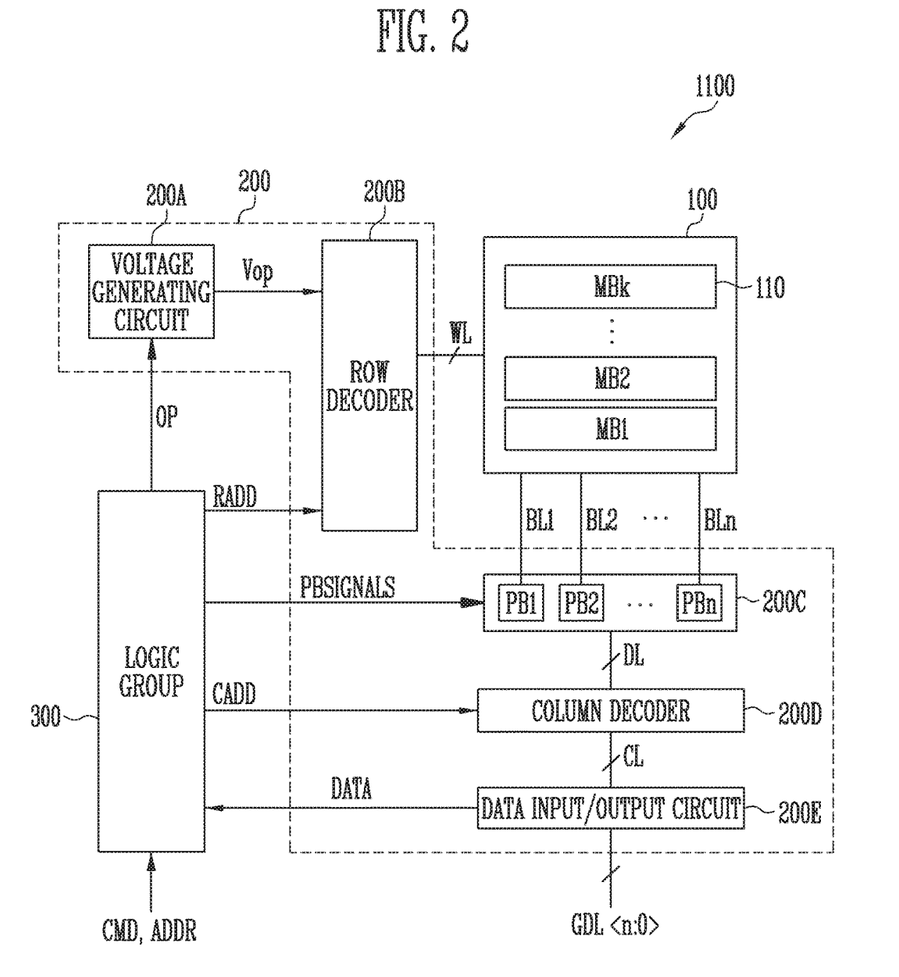
FIG. 2 is a diagram illustrating a memory device of FIG. 1 in accordance with an embodiment of the present disclosure.

FIG. 2 is a diagram illustrating the memory device 1100 in accordance with an embodiment of the present disclosure.

Referring to FIG. 2, the memory device 1100 may include a memory cell array 100 configured to store data. The memory device 1100 may include a peripheral circuit 200 configured to perform a program operation for storing data to the memory cell array 100, a read operation for outputting the stored data, and an erase operation for erasing the stored data. The memory device 1100 may include a logic group 300 configured to control the peripheral circuit 200 under control of the memory controller 1200.

The memory cell array 100 may include a plurality of memory blocks MB1 to MBk (110; k is a positive integer). Word lines WL and bit lines BL1 to BLn (n is a positive integer) may be coupled to each of the memory blocks MB1 to MBk (110). For example, the word lines WL may further include a first select line, a second select line, and dummy lines. The first select line may be a source select line. The second select line may be a drain select line. For example, the word lines WL may further include pipelines. The word lines WL may be coupled to each of the memory blocks MB1 to MBk (110). The bit lines BL1 to BLn may be coupled in common to the memory blocks MB1 to MBk (110). The memory blocks MB1 to MBk (110) may be embodied in a two- or three-dimensional structure. For example, in the memory blocks 110 having a two-dimensional structure, the memory cells may be arranged in a direction parallel to a substrate. For example, in the memory blocks 110 having a three-dimensional structure, the memory cells may be stacked in a direction perpendicular to the substrate.

The plurality of memory blocks MB1 to MBk may be divided into a free block on which a program operation has not been performed, a valid block on which a program operation has been performed and to which valid data has been stored, and an invalid block to which invalid data has been stored although a program operation has been performed. During a program operation, the memory device 1100 may select any one of free blocks and invalid blocks as a target memory block to be programmed, and defines the selected memory block as an open block. In the case where any one of the invalid blocks is selected as the open block, it is preferable that an erase operation be performed on the selected invalid block before the program operation is performed.

The peripheral circuit 200 may perform a program operation, a read operation, or an erase operation on a selected memory block 110 under control of the logic group 300. For example, during a program operation, the peripheral circuit 200 may supply a program voltage and a pass voltage to the word lines WL under control of the logic group 300, and may control potential levels of the bit lines BL1 to BLn depending on data to be programmed.

In an embodiment, the peripheral circuit 200 may include a voltage generating circuit 200A, a row decoder 200B, a page buffer group 200C, a column decoder 200D, and a data input/output circuit 200E.

The voltage generating circuit 200A may generate various operating voltages Vop to be used for the program, the read, and the erase operations in response to an operating signal OP. Furthermore, the voltage generating circuit 200A may selectively discharge the word lines WL in response to an operating signal OP. For example, the voltage generating circuit 200A may generate a program voltage, a verify voltage, a pass voltage, a read voltage, a source line voltage, etc. under control of the logic group 300.

The row decoder 200B may transmit operating voltages Vop to word lines WL coupled to a selected memory block 110 in response to a row address RADD.

The page buffer group 200C may include a plurality of page buffers PB1 to PBn coupled to the bit lines BL1 to BLn. The page buffers PB1 to PBn may operate in response to page buffer control signals PBSIGNALS. In an embodiment, during a program operation, the page buffers PB1 to PBn may temporarily store data which are received through data lines DL and are to be programmed, and may adjust the potential levels of the corresponding bit lines BL1 to BLn. During a read operation, the page buffers PB1 to PBn may temporarily store data received through the bit lines BL1 to BLn, and then output the data to the column decoder 200D through the data lines DL.

The column decoder 200D may transmit data between the input/output circuit 200E and the page buffer group 200C in response to a column address CADD. For example, the column decoder 200 may exchange data with the page buffers PB1 to PBn through the data lines DL, or exchange data with the data input/output circuit 200E through column lines CL.

The data input/output circuit 200E may exchange data with the column decoder 200D through the column lines CL, and exchange data with an external device (e.g., the memory controller 1200 of FIG. 1) through global data lines GDL<n:0>. Furthermore, the data input/output circuit 200E may temporarily store data received through the column lines CL or the global data lines GDL<n:0>.

The logic group 300 may output an operating signal OP, a row address RADD, page buffer control signals PBSIGNALS, and a column address CADD in response to a command CMD and an address ADDR received from the memory controller 1200.

During a program operation, the logic group 300 may control the peripheral circuit 200 to perform the program operation on a current open block, i.e., a target memory block to be programmed, among the plurality of memory blocks MB1 to MBk, and to perform, while performing the program operation on the current open block, sub-operations of an erase operation on a subsequent open block to be selected subsequent to the current open block. In addition, the logic group 300 may control the peripheral circuit 200 to perform the remaining sub-operations of the erase operation on the subsequent open block after the performing of the program operation on the current open block has been completed. After the performing of the erase operation on the subsequent open block has been completed, the logic group 300 may control the peripheral circuit 200 to select the subsequent open block as a current open block and perform a program operation on the selected current open block.

Figure 3:
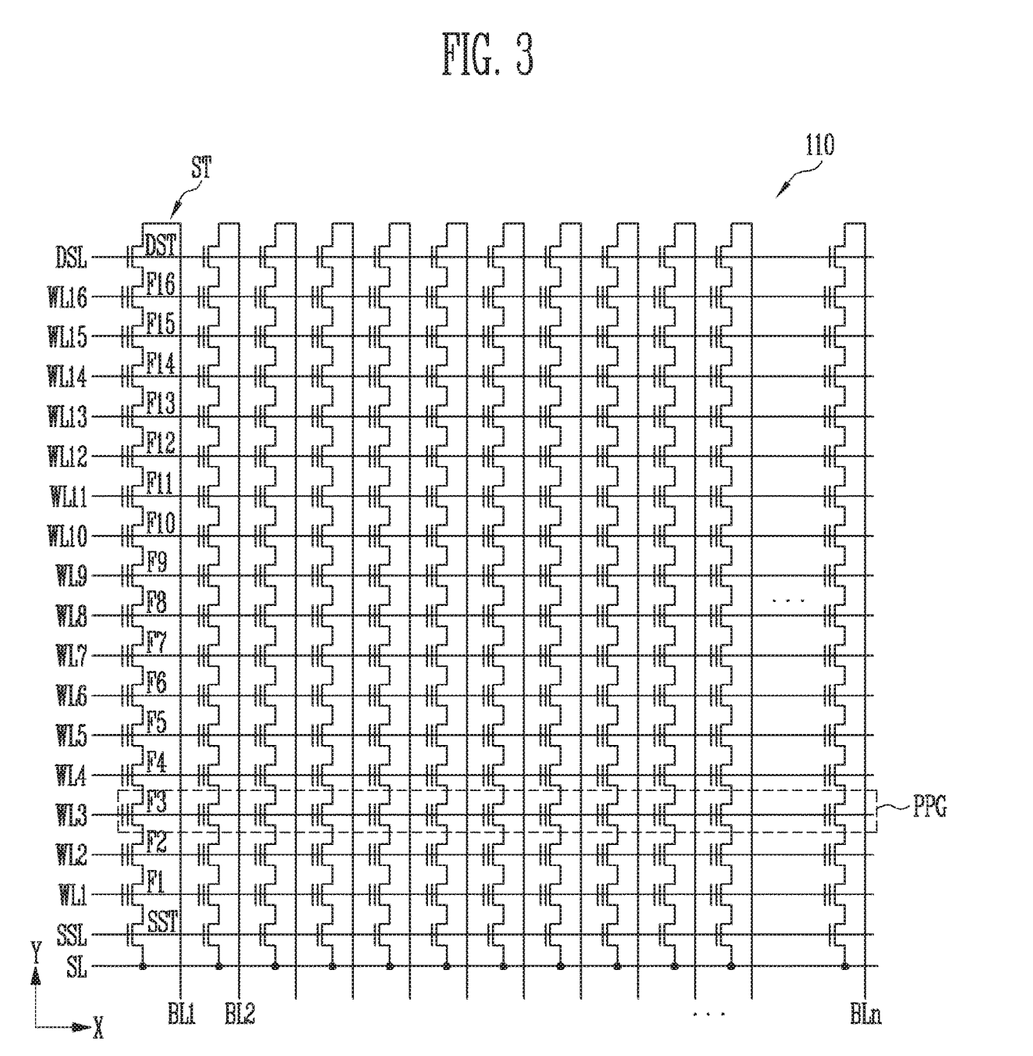
FIG. 3 is a diagram illustrating a memory block of FIG. 2 in accordance with an embodiment of the present disclosure.

FIG. 3 is a diagram illustrating a memory block 110 of FIG. 2 in accordance with an embodiment of the present disclosure.

Referring to FIG. 3, in the memory block 110, a plurality of word lines arranged parallel to each other may be coupled between a first select line and a second select line. Here, the first select line may be a source select line SSL, and the second select line may be a drain select line DSL. In more detail, the memory block 110 may include a plurality of strings ST coupled between the bit lines BL1 to BLn and the source line SL. The bit lines BL1 to BLn may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and more than the 16 memory cells (F1 to F16 shown in the drawing) may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block 110 may correspond to the number of word lines WL1 to WL16.

Each memory cell may store 1-bit data. This memory cell is typically called a single level cell SLC. In this case, each physical page PPG may store data of a singe logical page LPG. Data of each logical page LPG may include data bits corresponding to the number of cells included in a single physical page PPG. Each memory cell may store 2- or more-bit data. This memory cell is typically called a multi-level cell MLC. In this case, each physical page PPG may store data of two or more logical pages LPG.

Figure 4:
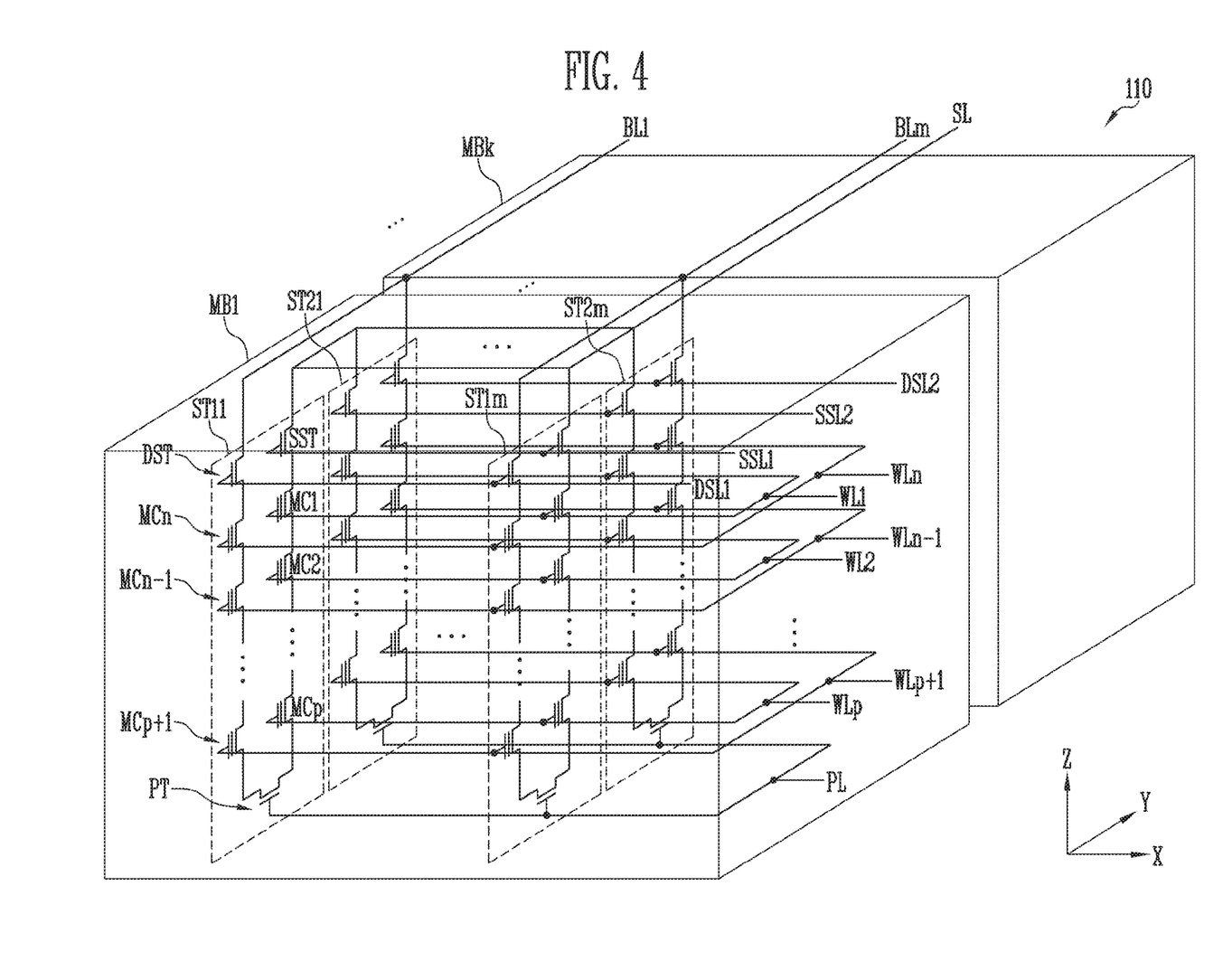
FIG. 4 is a diagram illustrating a memory block having a three-dimensional structure in accordance with an embodiment of the present disclosure.

FIG. 4 is a diagram illustrating a memory block having a three-dimensional structure in accordance with an embodiment of the present disclosure.

Referring to FIG. 4, the memory cell array 100 may include a plurality of memory blocks MB1 to MBk (110). Each memory block 110 may include a plurality of strings ST11 to ST1$m$ and ST21 to ST2$m$. In an embodiment, each of the strings ST11 to ST1$m$ and ST21 to ST2$m$ may be formed in a 'U' shape. In the first memory block MB1, m strings may be arranged in a row direction (i.e., an X direction). FIG. 4 illustrates two strings arranged in a column direction (i.e., in a Y direction); however, this is for clarity of illustration. Three or more strings may be arranged in the column direction (the Y direction).

Each of the plurality of strings ST11 to ST1$m$ and ST21 to ST2$m$ may include at least one source select transistor SST, first to n-th memory cells MC1 to MCn, a pipe transistor PT, and at least one drain select transistor DST.

The source and drain select transistors SST and DST and the memory cells MC1 to MCn may have structures similar to each other. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. In an embodiment, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction. Source select transistors of strings arranged in different rows may be coupled to different source select lines. In FIG. 4, source select transistors of the strings ST11 to ST1$m$ in a first row are coupled to a first source select line SSL1. Source select transistors of the strings ST21 to ST2$m$ in a second row are coupled to a second source select line SSL2.

In an embodiment, the source select transistors of the strings ST11 to ST1$m$ and ST21 to ST2$m$ may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to nth memory cells MCCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to nth word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1$m$ in the first row may be coupled to a first drain select line DSL1. The drain select transistors of the strings ST21 to ST2$m$ in the second row may be coupled to a second drain select line DSL2.

Strings arranged in the column direction may be coupled to corresponding bit lines extending in the column direction. In FIG. 4, the strings ST11 and ST21 in a first column may be coupled to a first bit line BL1. The strings ST1$m$ and ST2$m$ in an m-th column may be coupled to an m-th bit line BLm.

Among the strings arranged in the row direction, memory cells coupled to the same word line may form one page. For example, memory cells coupled to the first word line WL1 in the strings ST11 to ST1$m$ of the first row may form a single page. Memory cells coupled to the first word line WL1 in the strings ST21 to ST2$m$ of the second row may form another single page. When any one of the drain select lines DSL1 and DSL2 is selected, strings arranged in the corresponding row may be selected. When any one of the word lines WL1 to WLn is selected, a corresponding single page may be selected from among the selected strings.

Figure 5:
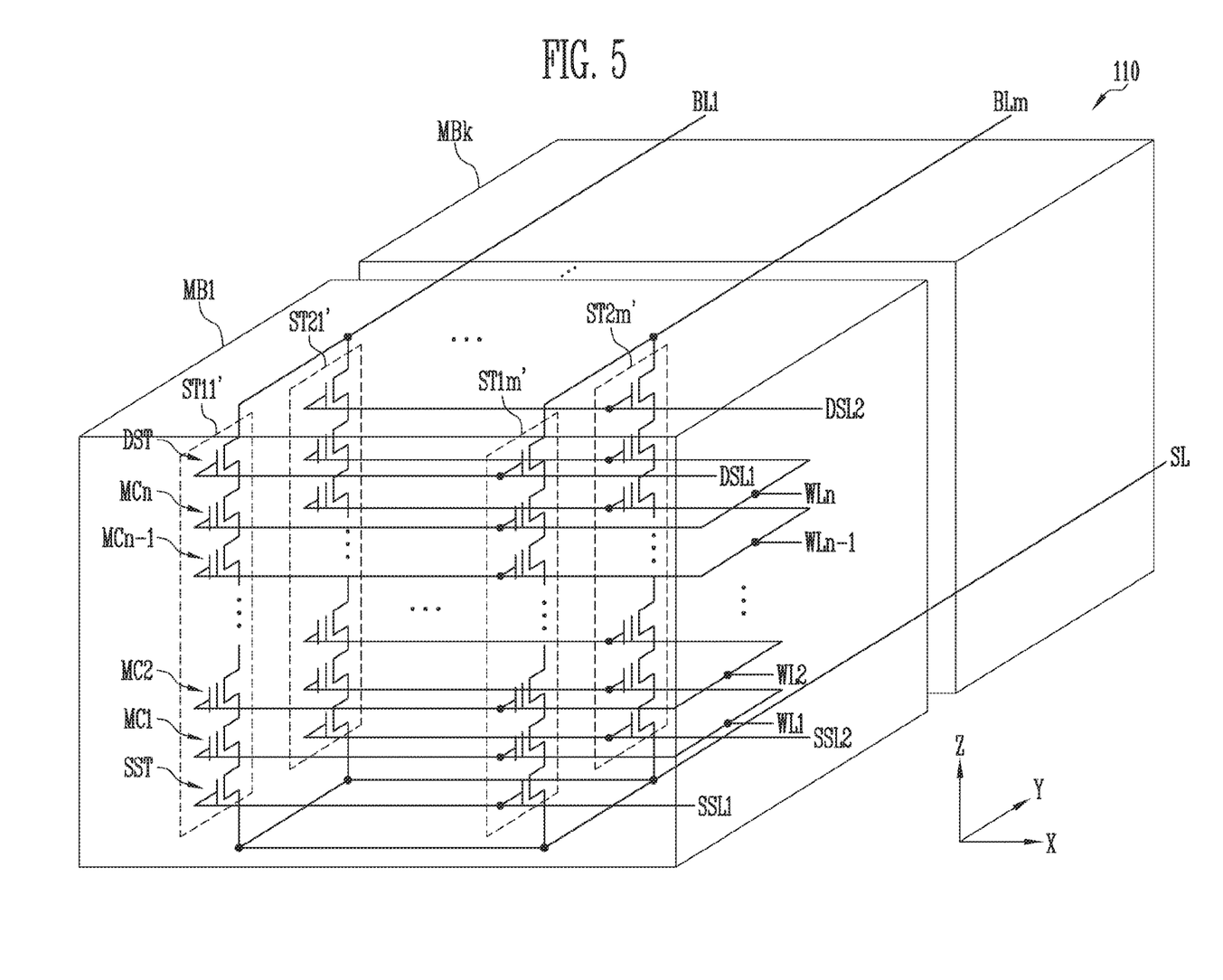
FIG. 5 is a diagram illustrating a memory block having a three-dimensional structure in accordance with an embodiment of the present disclosure.

FIG. 5 is a diagram illustrating a memory block having a three-dimensional structure in accordance with an embodiment of the present disclosure.

Referring to FIG. 5, the memory cell array 100 may include a plurality of memory blocks MB1 to MBk (110). Each memory block 110 may include a plurality of strings ST11' to ST1$m$' and ST21' to ST2$m$'. Each of the strings ST11' to ST1$m$' and ST21' to ST2$m$' may extend in a vertical direction (i.e., in a Z direction). In each memory block 110, strings may be arranged in a row direction (i.e., in an X direction). FIG. illustrates two strings arranged in a column direction (i.e., in a Y direction); however, this is for clarity of illustration. Three or more strings may be arranged in the column direction (the Y direction).

Each of the strings ST11' to ST1$m$' and ST21' to ST2$m$' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1$m$' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to nth memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. As a result, the reliability of data stored in each memory block 110 may be improved.

The drain select transistor DST of each string may be coupled between the corresponding bit line and the memory cells MC1 to MCn. Drain select transistors DST of strings arranged in the row direction may be coupled to corresponding drain select lines. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

In other words, the memory block 110 of FIG. 5 may have a circuit similar to that of the memory block 110 of FIG. 4. For example, the pipe transistor PT is excluded from each cell string in the memory block 110 of FIG. 5

Figure 6:
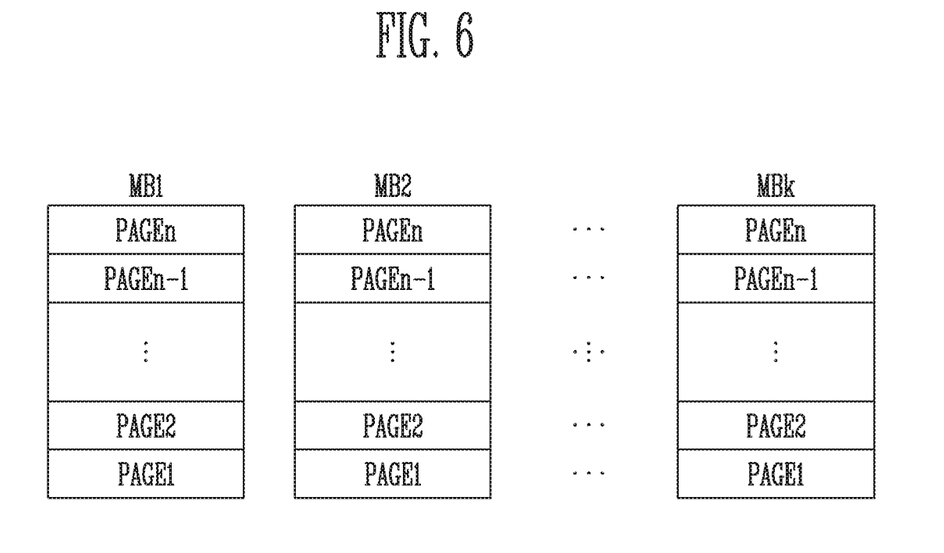
FIG. 6 is a diagram illustrating configurations of a plurality of memory blocks in accordance with an embodiment of the present disclosure.

FIG. 6 is a diagram illustrating configurations of a plurality of memory blocks MB1 to MBk in accordance with an embodiment of the present disclosure.

Referring to FIG. 6, each of the plurality of memory blocks MB1 to MBk may include a plurality of pages PAGE1 to PAGEn. In an embodiment, each of the plurality of pages PAGE1 to PAGEn may be a physical page, which is a group of memory cells coupled to an identical word line. During a program operation, each of the plurality of memory blocks MB1 to MBk may be programmed on a page basis. While the program operation is performed on the page basis, the pages may be sequentially selected and programmed. For example, the program operation may be performed in a forward manner in which the pages are sequentially selected and programmed from page PAGE1 to page PAGEn. Alternatively, the program operation may be performed in a reverse manner in which the pages are sequentially selected and programmed from page PAGEn to page PAGE1.

Figure 7:
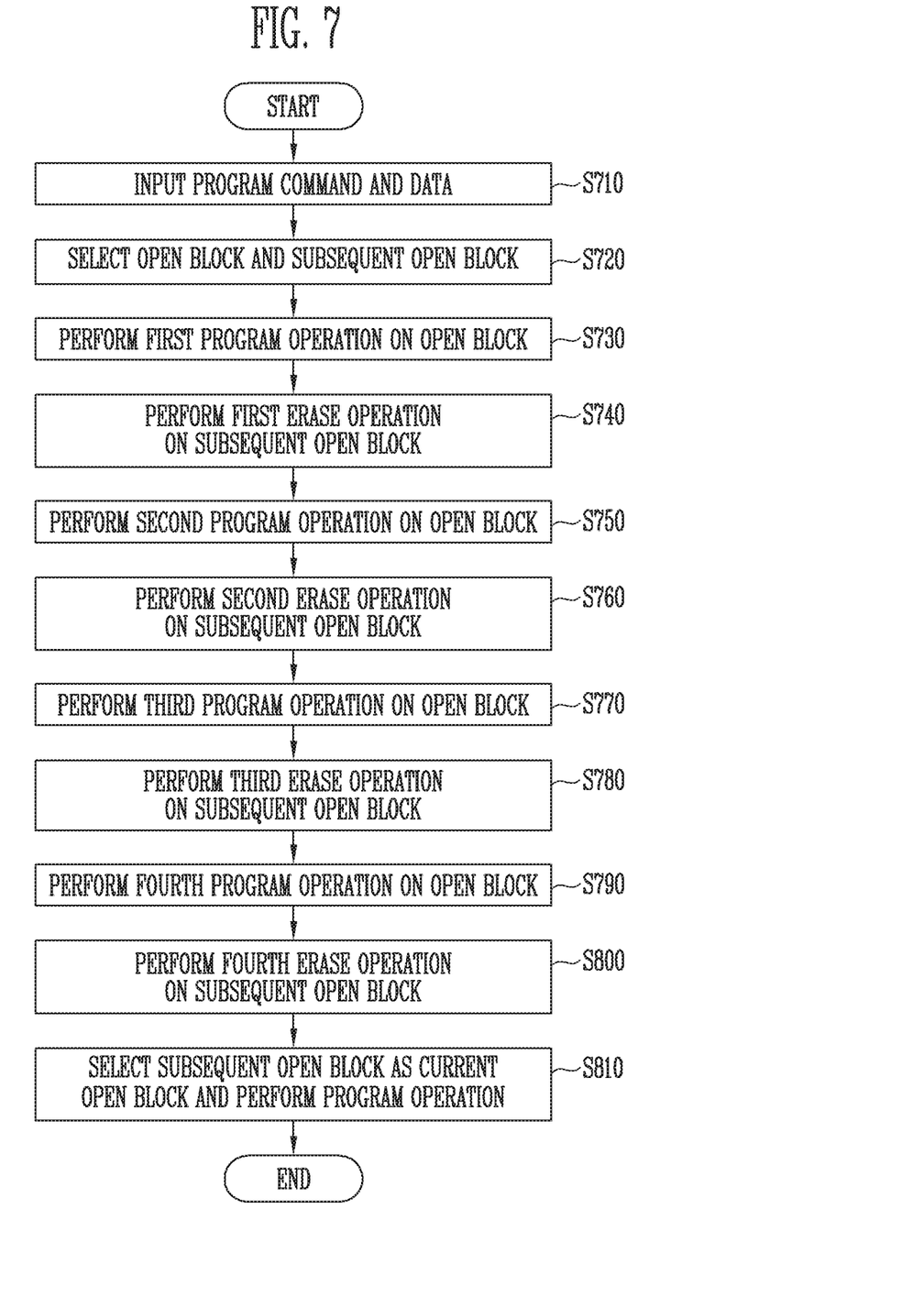
FIG. 7 is a flowchart illustrating operation of the memory system in accordance with an embodiment of the present disclosure.

FIG. 7 is a flowchart illustrating the operation of the memory system in accordance with an embodiment of the present disclosure.

Figure 8:
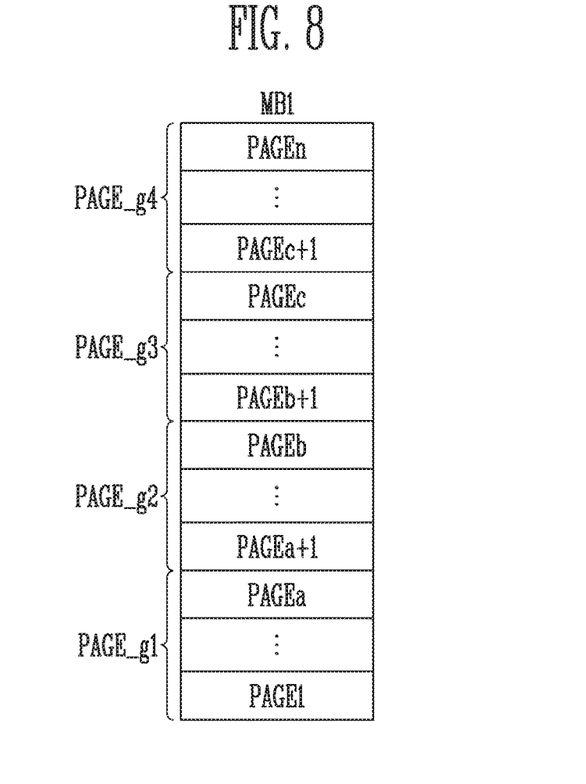
FIG. 8 is a diagram illustrating configuration of a memory block to describe the operation of the memory system in accordance with an embodiment of the present disclosure.

FIG. 8 is a diagram illustrating the configuration of a memory block to describe the operation of the memory system in accordance with an embodiment of the present disclosure.

Figure 9:
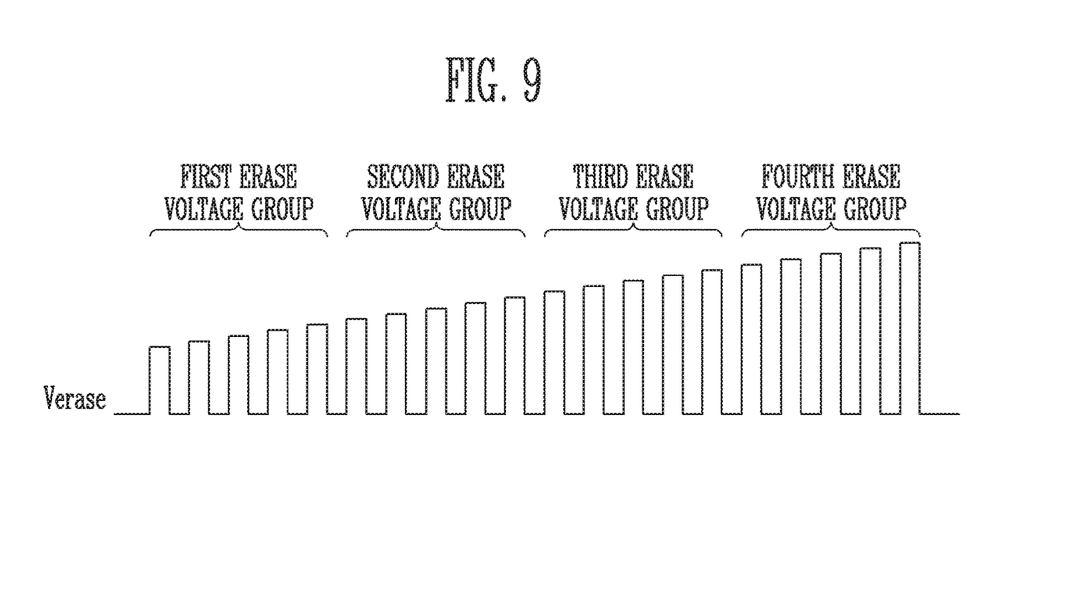
FIG. 9 is a diagram illustrating erase voltage groups in accordance with an embodiment of the present disclosure.

FIG. 9 is a diagram illustrating erase voltage groups in accordance with an embodiment of the present disclosure.

A method of operating the memory system in accordance with an embodiment of the present disclosure will be described with reference to FIGS. 1 to 9.

In response to a request from the host 2000, the memory controller 1200 may output a command CMD and an address ADDR corresponding to a program operation, and a plurality of data DATA to be programmed, to the memory device 1100 at step S710.

The memory controller 1200 may select one memory block (e.g., MB1), among the plurality of memory blocks MB1 to MBk in the memory device 1100, as an open block, i.e., a target memory block to be programmed, based on the command CMD and the amount of data DATA to be programmed, and select another memory block (e.g., MB2) as a subsequent open block, i.e., a target memory block to be programmed after a program operation on the current open block is completed at step S720. When the amount of data DATA to be programmed is less than data storage capacity of a single memory block, the subsequent open block may not be selected, and only a general program operation may be performed on the selected current open block. Each of the current open block and the subsequent open block may be selected from among free blocks and invalid blocks of the memory blocks MB1 to MBk. When the current open block is an invalid block, an erase operation may be performed on the current open block to convert it from the invalid block state to a free block state.

The memory device 1100 may receive the command CMD, the address ADDR, and the data DATA to be programmed from the memory controller 1200.

The logic group 300 may control the peripheral circuit 200 to perform a first program operation on the open block (e.g., MB1) in response to the command CMD and the address ADDR corresponding to the program operation at step S730.

As shown in FIG. 8, the selected open block (e.g., MB1) may include a plurality of pages PAGE1 to PAGEn, which may be grouped into a plurality of page groups PAGE_g1 to PAGE_g4. In an embodiment, the first program operation may be a program operation to be performed on a first page group PAGE_g1, which includes PAGE1 to PAGEa. With respect to grouping, embodiments of the disclosure are not limited to grouping the pages PAGE1 to PAGEn into first to fourth page groups PAGE_g1 to PAGE_g4; rather, the pages PAGE1 to PAGEn may be grouped into any number of two or more groups.

The operation of the logic group 300 and the peripheral circuit 200 during the first program operation will be described in more detail below.

During the first program operation, the pages PAGE1 to PAGEa in the first page group PAGE_g1 may be sequentially programmed in a page basis manner. During the program operation, the logic group 300 may output an operating signal OP, a row address RADD, page buffer control signals PBSIGNALS, and a column address CADD to control the peripheral circuit 200. The column decoder 200D may transmit, in response to the column address CADD, data received from the data input/output circuit 200E and to be programmed, to the page buffer group 200C. The page buffer group 200C may temporarily store, in response to the page buffer control signals PBSIGNALS, the data to be programmed, and apply a program allowable voltage (e.g., a ground voltage) or a program inhibit voltage (e.g., a supply voltage) to the bit lines BL1 to BLn based on the temporarily stored data. The voltage generating circuit 200A may generate and output, in response to the operating signal OP, operating voltages Vop including a program voltage and a pass voltage to be used for the program operation. The row decoder 200B may transmit, in response to the row address RADD, the operating voltage Vop output from the voltage generating circuit 200A to word lines coupled to selected memory block 110 and perform the program operation on a selected page among the pages PAGE1 to PAGEa included in the first page group PAGE_g1. If the program operation on the selected page is completed, a subsequent page may be selected from among the pages PAGE1 to PAGEa in the first page group PAGE_g1, and the above-mentioned page basis program operation may be re-performed on the selected subsequent page.

If the first program operation on the open block (e.g., MB1) is completed at step S730, the memory controller 1200 may control the memory device 1100 to perform a first erase operation on the subsequent open block (e.g., MB2) at step S740. The above-mentioned first erase operation may be performed when the subsequent open block (e.g., MB2) is an invalid block, and may be skipped when the subsequent open block (e.g., MB2) is a free block.

The erase operation of the memory device 1100 may be performed in an incremental step pulse erase (ISPE) manner in which erase voltages gradually increase. In an embodiment, the first erase operation may be performed using a first erase voltage group, among all erase voltages to be applied during the ISPE-type erase operation.

Referring to FIG. 9, in an embodiment, there are twenty (20), e.g., first to twentieth, erase voltages Verase to be applied during the ISPE-type erase operation, which means that the total number of erase voltage applying operations is twenty). In this embodiment, the first erase operation may be performed using a first erase voltage group (e.g., including the first to the fifth erase voltages).

The operation of the logic group 300 and the peripheral circuit 200 during the first erase operation will be described in more detail below.

During the first erase operation, if the memory block MB2 selected as the subsequent open block is an invalid block, the logic group 300 may output an operating signal OP for controlling the peripheral circuit 200. The voltage generating circuit 200A may generate a first erase voltage in response to the operating signal OP and apply the first erase voltage to the source line SL of the memory block MB2 selected as the subsequent open block. During an erase operation, the row decoder 200B may float the word lines WL coupled to the selected memory block MB2 for a set or predetermined time, and then change the levels of the word lines WL to the ground voltage (Vss) level. As a result, electrons stored in the memory cells included in the selected memory block MB2 are emitted by a channel having a high potential level and the word lines WL having the ground voltage level. In other words, data stored in the memory cells in the selected memory block MB2 are erased.

Subsequently, to perform the first erase operation, the logic group 300 and the peripheral circuit 200 may sequentially perform erase operations using the second to the fifth erase voltages obtained by gradually increasing the first erase voltage.

If the first erase operation on the subsequent open block (e.g., MB2) is completed at step S740, a second program operation is performed on the current open block (e.g., MB1) at step S750.

The logic group 300 may control the peripheral circuit 200 to perform the second program operation on the open block (e.g., MB1) in response to the command CMD and the address ADDR corresponding to the program operation. In an embodiment, the second program operation may be performed on a second page group PAGE_g2, including PAGEa+1 to PAGEb, among the plurality of page groups PAGE_g1 to PAGE_g4. The program operation on the second page group PAGE_g2 is similar to the program operation on the first page group PAGE_g1, therefore detailed description thereof is omitted here.

If the second program operation on the open block (e.g., MB1) is completed at step S750, the memory controller 1200 may control the memory device 1100 to perform a second erase operation on the subsequent open block (e.g., MB2) at step S760. In an embodiment, the second erase operation may be performed using a second erase voltage group, among all erase voltages Verase to be applied during the ISPE-type erase operation. In an embodiment, the second erase voltage group may include erase voltages subsequent to the above-mentioned first erase voltage group. For example, the second erase operation may be performed using the second erase voltage group (e.g., the sixth to the tenth erase voltages) subsequent to the first erase voltage group (e.g., the first to the fifth erase voltages), among all erase voltages (e.g., the first to the twentieth erase voltages) to be applied during the ISPE-type erase operation. The second erase operation is similar to the first erase operation; therefore, further explanation thereof is omitted here.

If the second erase operation on the subsequent open block (e.g., MB2) is completed at step S760, a third program operation is performed on the current open block (e.g., MB1) at step S770.

The logic group 300 may control the peripheral circuit 200 to perform the third program operation on the open block (e.g., MB1) in response to the command CMD and the address ADDR corresponding to the program operation. In an embodiment, the third program operation may be performed on a third page group PAGE_g3, including PAGEb+1 to PAGEc, among the plurality of page groups PAGE_g1 to PAGE_g4. The program operation on the third page group PAGE_g3 is similar to the program operation on the first page group PAGE_g1 therefore detailed description thereof is omitted here.

If the third program operation on the open block (e.g., MB1) is completed, the memory controller 1200 may control the memory device 1100 to perform a third erase operation on the subsequent open block (e.g., MB2) at step S780. In an embodiment, the third erase operation may be performed using a third erase voltage group, among all erase voltages to be applied during the ISPE-type erase operation. In an embodiment, the third erase voltage group may include erase voltages subsequent to the above-mentioned second erase voltage group. For example, the third erase operation may be performed using the third erase voltage group (e.g., the eleventh to the fifteenth erase voltages) subsequent to the second erase voltage group (e.g., the sixth to the tenth erase voltages), among all erase voltages (e.g., the first to the twentieth erase voltages) to be applied during the ISPE-type erase operation. The third erase operation is similar to the first erase operation; therefore, further explanation thereof is omitted here.

If the third erase operation on the subsequent open block (e.g., MB2) is completed at step S780, a fourth program operation is performed on the current open block (e.g., MB1) at step S790.

The logic group 300 may control the peripheral circuit 200 to perform the fourth program operation on the open block (e.g., MB1) in response to the command CMD and the address ADDR corresponding to the program operation. In an embodiment, the fourth program operation may be performed on a fourth page group PAGE_g4, including PAGEc+1 to PAGEn, among the plurality of page groups PAGE_g1 to PAGE_g4. The program operation on the fourth page group PAGE_g4 is similar to the program operation on the first page group PAGE_g1; therefore detailed description thereof is omitted here.

In this way, the program operation on the current open block (e.g., MB1) is completed.

If the program operation on the current open block (e.g., MB1) is completed, the memory controller 1200 may perform an erase operation on the subsequent open block (e.g., MB2) before selecting the subsequent open block (e.g., MB2) as a new open block. The erase operation on the subsequent open block (e.g., MB2) may be completed by performing only a fourth erase operation at step S800, because the first to the third erase operations on the subsequent open block (e.g., MB2) have been completed during the program operation on the current open block (e.g., MB1). In an embodiment, the fourth erase operation may be performed using the remaining erase voltages, other than those in the first to the third erase voltage groups, among all erase voltages to be applied during the ISPE-type erase operation. For example, the fourth erase operation may be performed using the remaining erase voltages (e.g., the sixteenth to the twentieth erase voltages) other than those in the first to the third erase voltage groups (e.g., the first to the fifteenth erase voltages), among all erase voltages (e.g., the first to the twentieth erase voltages) to be applied during the ISPE-type erase operation.

The memory controller 1200 may control the memory device 1100 to select the subsequent open block (e.g., MB2) as a new open block and perform a program operation on the new open block at step S810. When the new open block is selected, a new subsequent open block may be selected if the amount of data to be programmed is greater than data storage capacity of the new open block (e.g., MB2). During the program operation on the new open block (e.g., MB2), sub-operations of the erase operation (e.g., the first to the third erase operations of the first to the fourth erase operations) may be performed on the selected new subsequent open block.

As described above, in various embodiments of the present disclosure, during a program operation on a current open block, some operations (e.g., first to third erase operations) of an erase operation on a subsequent open block are performed. Consequently, the time required to perform the erase operation, which is performed before the subsequent open block is selected as a new open block, may be reduced.

In various embodiments of the present disclosure, there has been described the case where the program operation on the open block is divided into the first to the fourth program operations, but the present disclosure is not limited thereto. Rather, the program operation on the current open block may be divided into two or more program operations, and some operations of an erase operation on a subsequent open block may be performed between such program operations.

Figure 10:
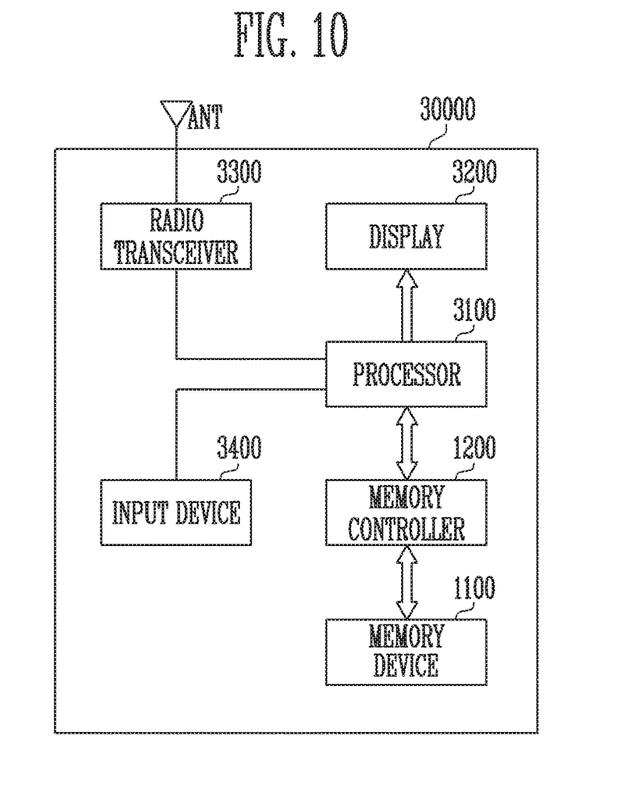
FIG. 10 is a diagram illustrating a memory system, including the memory device shown in FIG. 2, in accordance with an embodiment of the present disclosure.

FIG. 10 is a diagram illustrating a memory system 30000, including the memory device 1100 shown in FIG. 2, in accordance with an embodiment of the present disclosure.

Referring to FIG. 10, the memory system 30000 may be embodied in a cellular phone, a smartphone, a tablet PC, a personal digital assistant (PDA) or a wireless communication device. The memory system 30000 may include the memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be output through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the memory controller 1200, data output from the radio transceiver 3300, or data output form the input device 3400 is output through the display 3200.

In an embodiment, the memory controller 1200 capable of controlling the operation of the memory device 1100 may be embodied as a part of the processor 3100 or a chip provided separately from the processor 3100.

Figure 11:
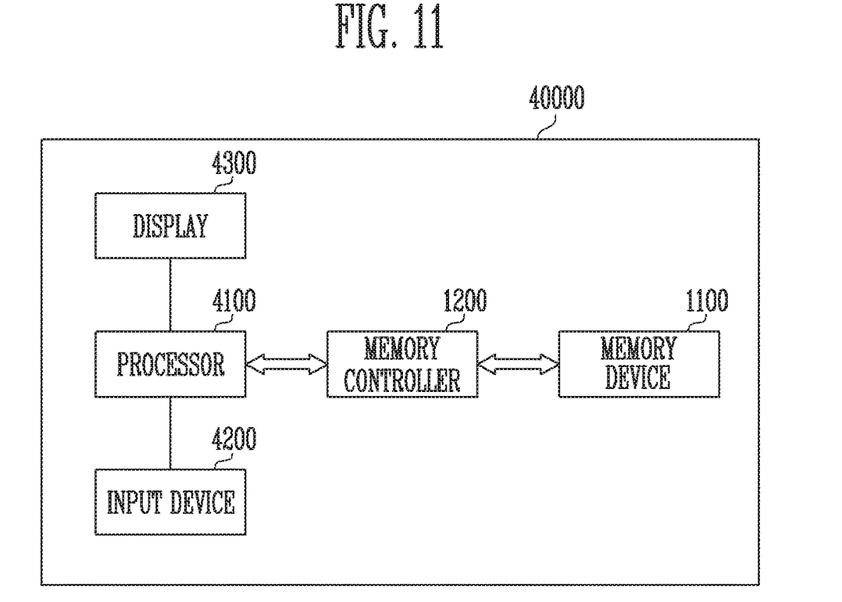
FIG. 11 is a diagram illustrating a memory system including the memory device shown in FIG. 2, in accordance with an embodiment of the present disclosure.

FIG. 11 is a diagram illustrating a memory system 40000, including the memory device 1100 shown in FIG. 2, in accordance with an embodiment of the present disclosure.

Referring to FIG. 11, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100, and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100.

Figure 12:
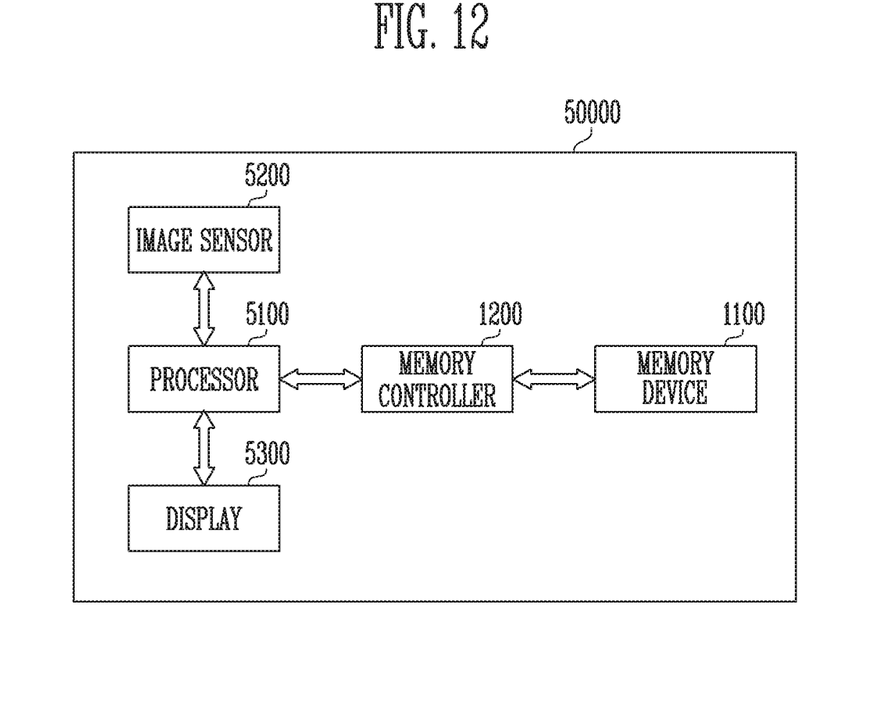
FIG. 12 is a diagram illustrating a memory system, including the memory device shown in FIG. 2, in accordance with an embodiment of the present disclosure.

FIG. 12 is a diagram illustrating a memory system 50000, including the memory device 1100 shown in FIG. 2, in accordance with an embodiment of the present disclosure.

Referring to FIG. 12, the memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100, and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored to the memory device 1100 through the memory controller 1200. Data stored in the memory device 1100 may be output through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100.

Figure 13:
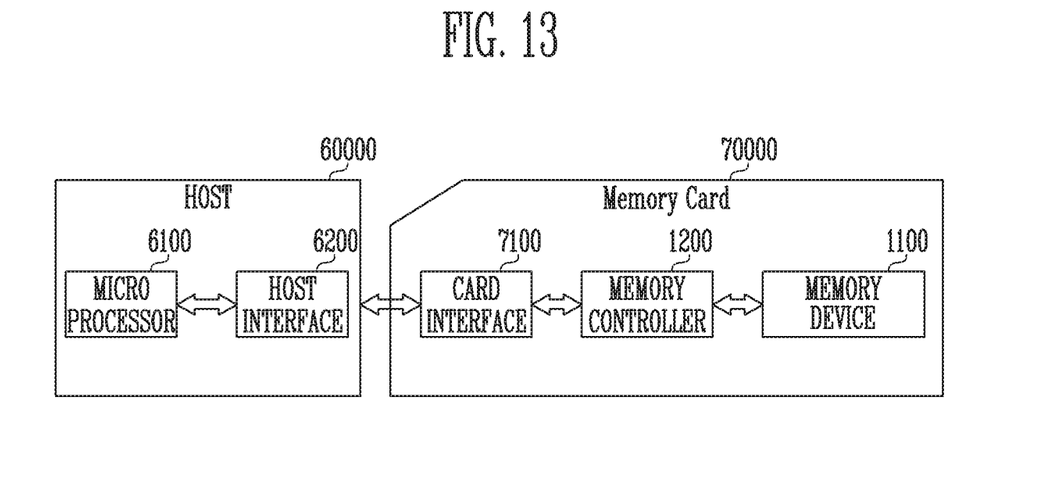
FIG. 13 is a diagram illustrating a memory system, including the memory device shown in FIG. 2, in accordance with an embodiment of the present disclosure.

FIG. 13 is a diagram illustrating a memory system 70000, including the memory device 1100 shown in FIG. 2, in accordance with an embodiment of the present disclosure.

Referring to FIG. 13, a memory system 70000 may be embodied in a memory card or a smart card. The memory system 70000 may include the memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

According to various embodiments of the present disclosure, during a program operation on a current open block, sub-operations of an erase operation on a subsequent open block is performed. As a result, when the subsequent open block is selected, the time required to perform the erase operation on the subsequent open block may be reduced. Consequently, electrical characteristics of a memory system may be improved.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
 a memory cell array including a plurality of memory blocks;
 a peripheral circuit configured to perform a program operation and an erase operation on any of the plurality of memory blocks; and
 a logic group configured to control the peripheral circuit to perform the program operation and the erase operation,
 wherein the logic group controls the peripheral circuit to select a first open memory block and a second open memory block, among the plurality of memory blocks, and alternately perform the program operation on the first open memory block and sub-operations of an erase operation on the second open memory block.

2. The memory device according to claim 1, wherein the program operation on the first open memory block comprises first to N-th program operations, where N is a natural number greater than 1.

3. The memory device according to claim 2, wherein each of the plurality of memory blocks comprises first to N-th page groups, where N is a natural number greater than 1.

4. The memory device according to claim 3, wherein the logic group controls the peripheral circuit to perform, during each of the first to the N-th program operations, a program operation on one of the first to the N-th page groups.

5. The memory device according to claim 3, wherein the sub-operations of the erase operation on the second open memory block comprises first to N-th sub-operations, where N is a natural number greater than 1.

6. The memory device according to claim 5, wherein the logic group controls the peripheral circuit to alternately perform the first to the N-th program operations and the first to the N-th sub-operations of the erase operation.

7. The memory device according to claim 5,
 wherein the logic group controls the peripheral circuit to perform the sub-operations of the erase operation on the second open memory block in an incremental step pulse erase (ISPE) manner, and
 wherein the sub-operations of the erase operation performed in the ISPE manner comprises first to N-th erase voltage groups, where N is a natural number greater than 1.

8. The memory device according to claim 7, wherein each of the first to the N-th sub-operations is an erase operation using one of the first to the N-th erase voltage groups.

9. A memory system comprising:
 a memory device comprising a plurality of memory blocks, and configured to select a current open block and a subsequent open block, among the plurality of memory blocks, to perform a program operation on each of the selected open blocks; and
 a memory controller configured to control the memory device to perform the program operation in response to a request from a host such that, while performing the program operation on the current open block, the memory device performs sub-operations of an erase operation on the subsequent open block in an incremental step pulse erase (ISPE) manner, the sub-operations comprising first to N-th sub-operations corresponding to first to N-th erase voltage groups respectively, where N is a natural number greater than 1.

10. The memory system according to claim 9, wherein the program operation on the current open block comprises first to N-th program operations, where N is a natural number greater than 1.

11. The memory system according to claim 10, wherein each of the plurality of memory blocks comprises first to N-th page groups, where N is a natural number greater than 1.

12. The memory system according to claim 11, wherein the first to the N-th program operations are performed on the first to the N-th page groups, respectively.

13. The memory system according to claim 11, wherein the sub-operations of the erase operation on the subsequent open block comprises first to N-th sub-operations, where N is a natural number greater than 1.

14. The memory system according to claim 13, wherein the memory device alternately performs the first to the N-th program operations and the first to N-th sub-operations of the erase operation.

15. The memory system according to claim 13, wherein the first to the N-th sub-operations use first to the N-th erase voltage groups respectively.

16. A method of operating a memory system, comprising:
selecting a current open block and a subsequent open block, among a plurality of memory blocks, during a program operation;
performing a first program operation on one of at least two page groups in the current open block;
performing a first erase operation on the subsequent open block, the first erase operation using a first erase voltage group;
performing a second program operation on another of the at least two or more page groups in the current open block; and
performing a second erase operation on the subsequent open block, the second erase operation using a second erase voltage group having an erase voltage level higher than an erase voltage level of the first erase voltage group.

17. The method according to claim 16, wherein the first and the second program operations and the first and the second erase operations are alternately performed.

18. The method according to claim 16, wherein, when the program operation on the open block is completed, the subsequent open block is selected as a new open block, and a program operation is performed on the new open block.

19. The method according to claim 18, wherein, when the subsequent open block is selected as the new open block, one of the plurality of memory blocks is selected as a new subsequent open block.

* * * * *